United States Patent [19]

Ito et al.

[11] Patent Number: 4,545,114
[45] Date of Patent: Oct. 8, 1985

[54] METHOD OF PRODUCING SEMICONDUCTOR DEVICE

[75] Inventors: Takashi Ito, Kawasaki; Toshihiro Sugii, Tokyo; Tetsu Fukano, Kanagawa; Hiroshi Horie, Ebina, all of Japan

[73] Assignee: Fujitsu Limited, Kawasaki, Japan

[21] Appl. No.: 537,017

[22] Filed: Sep. 29, 1983

[30] Foreign Application Priority Data

Sep. 30, 1982 [JP] Japan ................................. 57-172027
Sep. 30, 1982 [JP] Japan ................................. 57-172024
Sep. 30, 1982 [JP] Japan ................................. 57-172025
Sep. 30, 1982 [JP] Japan ................................. 57-172026

[51] Int. Cl.$^4$ .................... H01L 21/302; H01L 21/31
[52] U.S. Cl. ........................................ 29/579; 29/571; 29/578; 29/576 B; 148/186; 148/187; 148/188; 148/1.5
[58] Field of Search ............ 29/571, 578, 579, 576 B; 148/186, 187, 188, 1.5; 357/35, 59

[56] References Cited

U.S. PATENT DOCUMENTS 3,916,509 11/1975 Hoeberechts et al. ............... 29/578
4,084,987  4/1978 Godber .............................. 29/578
4,148,054  4/1979 Hart et al. .......................... 357/44
4,157,269  6/1979 Ning et al. ......................... 148/1.5
4,261,095  4/1981 Dreves et al. ...................... 29/571
4,319,932  3/1983 Iambotkar .......................... 148/1.5
4,351,099  9/1982 Takagi et al. ...................... 29/571
4,358,891  3/1982 Roesner ............................ 29/571
4,378,627  4/1983 Jambotkar .......................... 29/571
4,381,953  5/1983 Ho et al. ........................... 29/576 B
4,417,385 11/1983 Temple ............................. 29/576 B

OTHER PUBLICATIONS

Japanese Journal of Applied Physics, "High Speed Bipolar ICs Using Super Self-Aligned Process Technology", Tetsushi Sakai et al., vol. 20, (1981), Supplement 20-1, pp. 155-159, (Proceedings of the 12th Conference on Solid-State Devices, Tokyo, 1980).
Petersen, "Ultra-Thin Base, Beam-Crystallized Bipolar Transistor", IBM Techn. Discl. Bull., vol. 22, No. 11, 4/80.

Primary Examiner—Brian E. Hearn
Assistant Examiner—Hunter L. Auyang
Attorney, Agent, or Firm—Staas & Halsey

[57] ABSTRACT

A bipolar or MOS semiconductor device is produced by self-alignment by (a) forming an insulating film on a semiconductor substrate, (b) forming a first conductive film, on the semiconductor substrate and (c) forming a first masking film having a window. The conductive film is then (d) anisotropically etched to form an opening and then, (e) transversely etched to form a protruding portion of the first masking film. A second masking film is (f) forming a second masking film on the insulating film through the window, (g) an uncovered portion of the insulating film under the protruding portion, is etched and (h) a second conductive film connecting the first conductive film and the exposed portion of the semiconductor substrate is formed.

18 Claims, 48 Drawing Figures

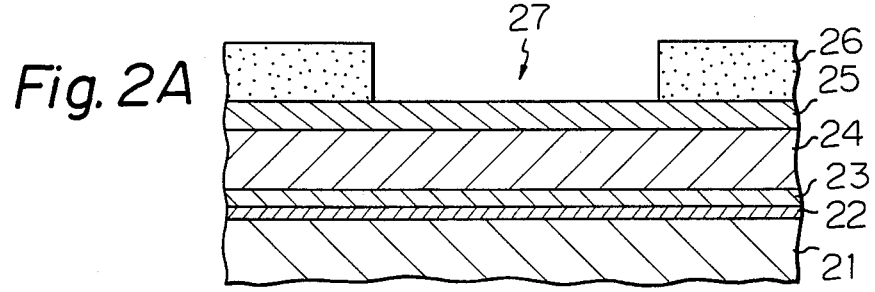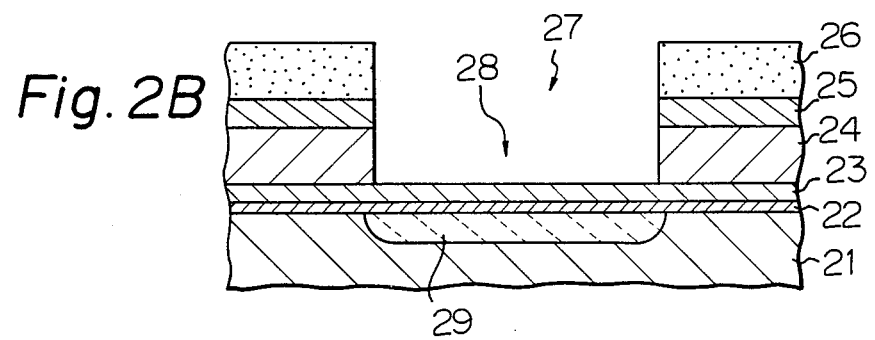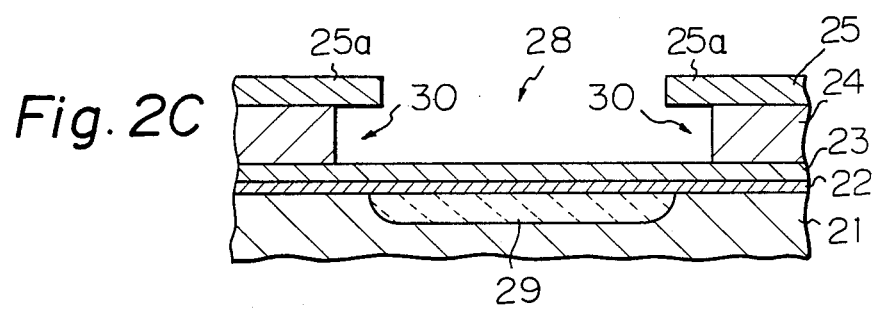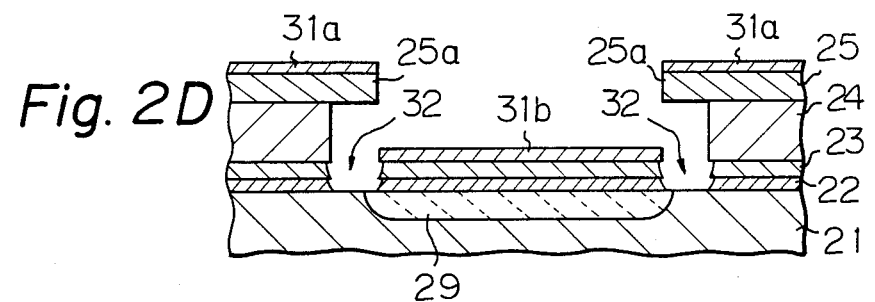

METHOD OF PRODUCING SEMICONDUCTOR DEVICE

BACKGROUND OF THE INVENTION

1. Field of the Invention

The present invention relates to a method of producing a semiconductor device, such as an integrated circuit (IC) of bipolar transistors or metal oxide semiconductor (MOS) transistors.

2. Description of the Prior Art

In order to improve the performance of semiconductor devices and to increase their density, persons skilled in the art have been reducing the dimensions of the component elements. For example, they are narrowing the base width of bipolar transistors and shortening the channel length of MOS transistors so as to increase the gain and decrease the parasitic capacitance, thereby resulting in increased operating speeds. One method of reducing the dimensions of elements is the fine processing technique wherein fine patterns of, for example a resist film, insulating film, conductive film, etc., are formed for miniaturization. Along with this fine processing technique, attempts have been made to self-align fine patterns with previous fine patterns. In production of a bipolar semiconductor device, it has been proposed to form active regions of a bipolar transistor by a self-alignment system using a mask (for example, cf. Proc. of 12th Conf. on Solid State Devices, Tokyo, Aug. 1980, pp. 67–68 (abstract from Tetsushi Sasaki et al., "HIGH SPEED BIPOLAR IC'S USING SUPER SELF-ALIGNED PROCESS TECHNOLOGY", Proc. of 12th Conf. on Solid-State Devices, Japanese Journal of Applied Physics, Vol. 20, (1981), Supplement 20-1, pps. 155–159), and Japanese Unexamined Patent Publication (Kokai) No. 57-178364). This technique, however, involves a relatively large number of complex production steps and makes it difficult to obtain sufficient control of dimensions. In the production of an MOS semiconductor device, a source region and a drain region have been self-aligned by using a polycrystalline silicon gate. No other means of self-alignment of the source and drain regions, however, has yet been practiced.

SUMMARY OF THE INVENTION

An object of the present invention is to produce a denser semiconductor device by utilizing an improved self-alignment system.

Another object of the present invention is to decrease the area required for electrodes coming into contact with a base contact region, a source region, and a drain region, and to decrease the area of a base region including the base contact region, the source region, and the drain region, so as to decrease the parasitic capacitance, to increase the operating speed and increase the degree of integration.

Still another object of the present invention is to provide a method of producing, by self-alignment, an MOS semiconductor device without use of a polycrystalline silicon gate as a mask.

The above and other objects of the present invention are attained by a method of producing a semiconductor device which includes the steps of: (a) forming a first insulating film on a semiconductor substrate; (b) forming a first conductive film on the first insulating film; (c) forming a first masking film having a window, on the conductive film; (d) selectively etching the first conductive film to form an opening having similar dimensions to those of the window; (e) transversely etching the first conductive film to enlarge the opening and form a protruding portion of the first masking film; (f) forming a second masking film on the first insulating film through the window; (g) selectively etching an uncovered portion of the first insulating film under the protruding portion to expose a surface portion of the semiconductor substrate; and (h) forming a second conductive film connecting the first conductive film and the exposed surface portion of the semiconductor substrate.

According to the present invention, only one mask is used for forming a window of the masking film after which steps (d) through (h) can be carried out by self-alignment.

BRIEF DESCRIPTION OF THE DRAWINGS

The present invention will become more apparent from the description of the preferred embodiments set forth below, with reference to the accompanying drawings, wherein:

FIGS. 2A through 2H are partial sectional views of a bipolar semiconductor device in various stages of production in accordance with a second embodiment of the present invention;

DESCRIPTION OF THE PREFERRED EMBODIMENTS

A process for producing a bipolar semiconductor device in accordance with a first embodiment of the present invention, is illustrated in FIGS. 1A to 1I.

Figure 1A:
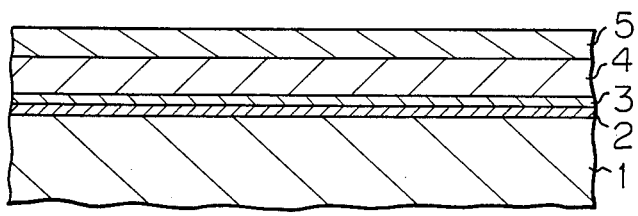
FIG. 1A through 1I are partial sectional views of a bipolar semiconductor device in various stages of production in accordance with an embodiment of the present invention.

Referring to FIG. 1A, a thin silicon dioxide ($SiO_2$) film 2 having a thickness of, e.g., approximately 50 nm is formed on a semiconductor substrate 1 by thermally oxidizing the silicon substrate 1. The substrate 1 comprises an N-type silicon semiconductor layer and a P-type silicon semiconductor substrate having an $N^+$-type buried layer, the N-type layer being epitaxially grown on the P-type substrate. A silicon nitride ($Si_3N_4$) film 3 having a thickness of, e.g., approximately 100 nm is formed on the $SiO_2$ film 2 by a chemical vapor deposition (CVD) method. The $SiO_2$ film 2 and $Si_3N_4$ film 3 serve as an insulating film. A first polycrystalline silicon film (a first conductive film) 4 which is doped with boron of, e.g., approximately $1 \times 10^{20}/cm^3$ and has a thickness of, e.g., approximately 300 nm is formed on the $Si_3N_4$ film 3 by a low pressure CVD (LPCVD) method. A $SiO_2$ film 5 having a thickness of, e.g., approximately 200 nm is formed on the first polycrystalline silicon film 4 by a CVD method.

Figure 1B:
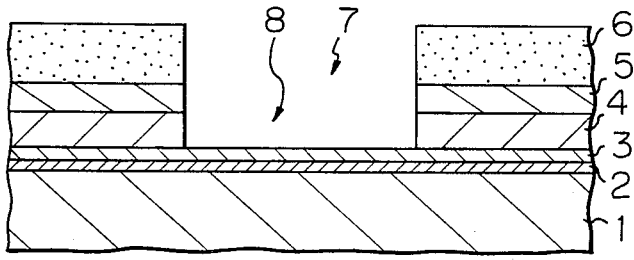

Referring to FIG. 1B, a resist film, e.g., a photoresist film 6 is spin coated on the SiO$_2$ film 5, exposed, and developed to form a window 7. The exposure is performed with a patterned light through a mask (i.e., a photomask). An electron beam exposure method may be used by using electron beam resist instead of the photoresist 6. The SiO$_2$ film 5 and the polycrystalline silicon film 4 are successively anisotropically etched by using the resist film 6 (i.e., a first masking film) as a mask, so that an opening 8 having similar dimensions to the window 7 is formed. The etching steps are carried out by utilizing a reactive ion etching method using CHF$_3$ gas or CCl$_4$ gas as an etchant.

Figure 1C:
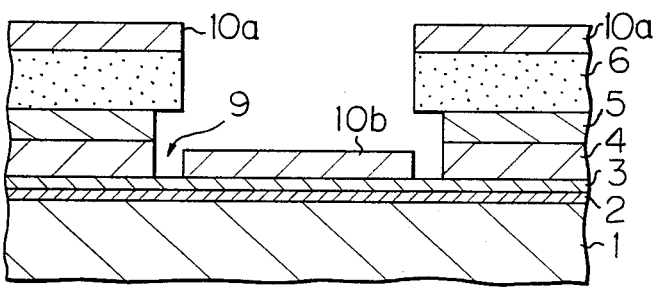

Referring to FIG. 1C, the SiO$_2$ film 5 is transversely etched so as to enlarge the opening 8 by means of a buffer solution of hydrofluoric acid, e.g., a solution of HF/NH$_4$F. Then, the first polycrystalline silicon film 4 is also transversely etched by a plasma etching method using a mixture of CF$_4$ gas and O$_2$ gas. Thus, a protruding portion of the resist film 6 is formed around the window 7 and a cavity 9 having a depth of, e.g., approximately 200 nm is formed under the protruding portion. Next, aluminum (Al) is deposited on the resist film 6 and on the Si$_3$N$_4$ film 3 through the window 7 by a vacuum deposition method or a sputtering method to form an Al film 10a and another Al film (a second masking film) 10b, respectively. The Al film 10b covers a portion of the Si$_3$N$_4$ film 3 but does not cover the portion of the film 3 under the protruding of the resist film 6, as shown in FIG. 1C.

Figure 1D:
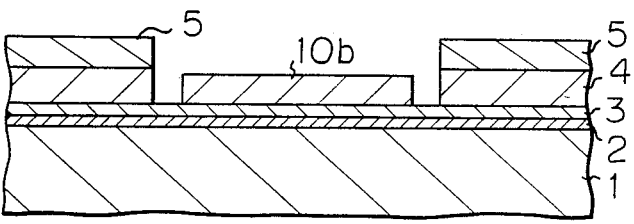

Referring to FIG. 1D, the resist film 6 is removed by means of a solvent, whereupon the Al film 10a on the resist film 6 is also removed. Such removal of the Al film is called a lift-off process. As a result, only the Al film 10b remains.

Figure 1E:
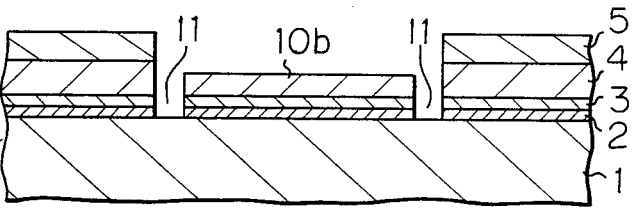

Referring to FIG. 1E, the Si$_3$N$_4$ film 3 and the SiO$_2$ film 2 are selectively etched by a reactive ion etching method using a gas etchant, e.g., CHF$_3$ gas or a mixture of CF$_4$ and O$_2$ gas (CF$_4$/O$_2$ gas), to form an opening 11. In the opening 11 a portion of the semiconductor substrate 1 is exposed. The Al film 10b and the SiO$_2$ film 5 serve as a mask in the etching treatment. In this case, the SiO$_2$ film 5 is also etched to decrease the thickness thereof. However, since the SiO$_2$ film 5 is relatively thick, it remains.

Figure 1F:
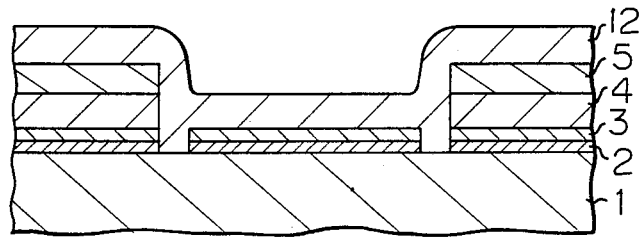

Referring to FIG. 1F, after the removal of the Al film 10b by a wet etching method, a second polycrystalline silicon film 12 having a thickness of, e.g., 400 nm, is formed on the SiO$_2$ film 5, the Si$_3$N$_4$ film 3 and the exposed portion of the semiconductor substrate 1 by a LPCVD method.

Figure 1G:
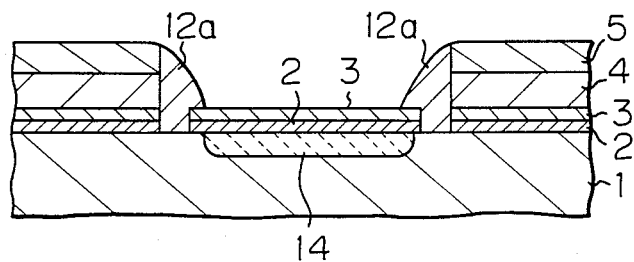

Referring to FIG. 1G, the second polycrystalline silicon film 12 is anisotropically etched in a direction perpendicular to the semiconductor substrate 1 to expose at least the Si$_3$N$_4$ film 3 by a reactive ion etching method using CCl$_4$ gas or CF$_4$/O$_2$ gas as an etchant. As a result, a portion 12a of polycrystalline silicon remains so as to adjoin the wall of the opening 8, i.e., the sides of the SiO$_2$ film 5, and the first polycrystalline silicon film 4. The polycrystalline silicon portion 12a serves as a second conductive film connecting the first polycrystalline silicon film 4 and the semiconductor substrate 1. Then, P-type impurities, e.g., boron ions, are introduced into the semiconductor substrate 1 through the Si$_3$N$_4$ film 3 and the SiO$_2$ film 2 by an ion-implantation method to form a base (P-type) region 14. For example, a boron ion dose of approximately $8 \times 10^{12}$ ions/cm$^2$ is used.

Figure 1H:
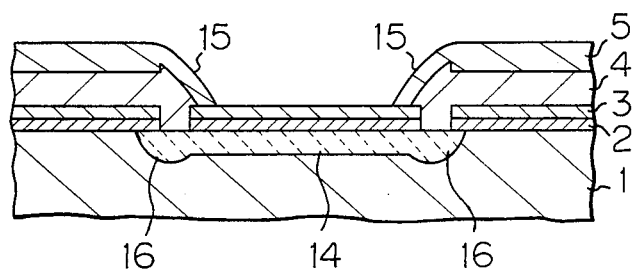

Referring to FIG. 1H, the obtained semiconductor device is heat-treated under a wet oxidizing atmosphere at a temperature of 900° C. to oxidize the polycrystalline silicon portion 12a, so that a SiO$_2$ film 15 having a thickness of approximately 200 nm is formed. During the heat-treatment, boron contained in the first polycrystalline silicon 4 diffuses into the semiconductor substrate 1 through the polycrystalline silicon portion 12a to form a P$^+$-type region (i.e., a base contact region) 16.

Figure 1I:
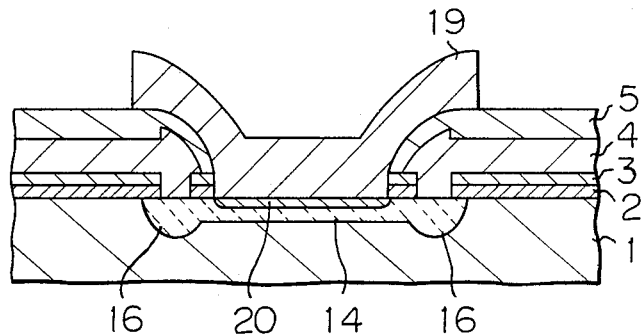

Referring to FIG. 1I, the Si$_3$N$_4$ film 3 and the SiO$_2$ film 2 are anisotropically etched by a reactive ion etching method to expose a surface of the semiconductor substrate 1 in the base region 14. At the same time, the SiO$_2$ film 15 is also etched to decrease the thickness thereof. However, since the SiO$_2$ film 15 is relatively thick, the SiO$_2$ film 15 remains. The above-mentioned steps of the formation of the opening 8 through the step of the removal of the Si$_3$N$_4$ film 3 and the SiO$_3$ film 2 can be carried out by self-alignment without using any masks. Next, a third polycrystalline silicon film doped with N-type impurities, e.g., arsenic, is formed on the SiO$_2$ film 5 and the base region 14 of the semiconductor substrate 1 by a LPCVD method and is patterned by a conventional lithographic method (e.g., a photo-lithographic method) to form an emitter electrode 19 of the third polycrystalline silicon film. It is possible to use a doped silicide instead of polycrystalline silicon. Then, a heat-treatment (at approximately 1000° C. for 10 minutes) is carried out so as to diffuse arsenic out of the emitter electrode 19 into the semiconductor substrate 1 within the base region 14, so that an N$^+$-type region (an emitter region) 20 is formed. Thus, it is possible to produce a bipolar transistor having an emitter region 20 of a length not more than 0.5 μm and a base region 14 and base contact region 16 of a total length not more than 1.5 μm. The base contact region 16, the base region 14, and the emitter region 20 can be formed by self-alignment without taking any alignment margin into consideration. Accordingly, the the regions can be formed smaller, and a denser bipolar semiconductor device can be produced. As a result, parasitic capacitance can be decreased and performance of the bipolar transistor can be improved.

A process for producing a bipolar semiconductor device in accordance with a second embodiment of the present invention is illustrated in FIGS. 2A to 2H.

Referring to FIG. 2A, a semiconductor substrate 21, a SiO$_2$ film 22, a Si$_3$N$_4$ film 23, and a first polycrystalline silicon film 24 doped with boron correspond to the semiconductor substrate 1, the SiO$_2$ film 2, the Si$_3$N$_4$ film 3, and the first polycrystalline silicon film 4 in the first embodiment, respectively, and are formed in the same manner as described in the first embodiment. A SiO$_2$ film 25 having a thickness of, e.g., approximately 200 nm, is formed on the first polycrystalline silicon film 24 by thermally oxidizing the polycrystalline silicon. Then, a resist film (a photoresist film) 26 is spin coated on the SiO$_2$ film 25, exposed, and developed to form a window 27. The exposure is performed with patterned light through a photomask.

Referring to FIG. 2B, the SiO$_2$ film 5 and the first polycrystalline silicon film 24 are successively anisotropically etched by using the resist film 26 as a mask, so that an opening 28 having similar dimensions to those of the window 27 is formed. P-type impurities, e.g., boron ions are introduced into the semiconductor substrate 21 at a dose of approximately $8 \times 10^{12}$ ions/cm$^2$ by an ion-implantation method, so that a base (P-type) region 29 is formed. Then the resist film 26 is removed. The removal of the resist film 26 may be carried out before the ion-implantation step.

Referring to FIG. 2C, using the SiO$_2$ film 25 as a mask, the first polycrystalline silicon film 24 is transversely etched so as to enlarge the opening 28 by a plasma etching method using a CF$_4$/O$_2$ gas. In this case, the SiO$_2$ film 25 serves as a first masking film. As a result of the etching, a protruding portion 25a of the SiO$_2$ film 25 appears and a cavity 30 having a depth of, e.g., approximately 200 nm, is formed under the protruding portion.

Referring to FIG. 2D, Al is deposited on the SiO$_2$ film 25 and the Si$_3$N$_4$ film 23 through the opening 28 by a vacuum deposition method or a sputtering method to form an Al film 31a and another Al film (a second masking film) 31b, respectively. The Al film 31b does not cover the portion of the Si$_3$N$_4$ film 23 under the protruding portion 25a. Using the Al films 31a and 31b as masks, the uncovered portion of the Si$_3$N$_4$ film 23 is etched by a plasma etching method using a CF$_4$/O$_2$ gas as an etchant. Then, the Al film 31a and 31b are removed. The portion of the SiO$_2$ film 22 under the protruding portion 25a is etched by a wet etching method using a solution of HF/NH$_4$F to form an opening 32 wherein a portion of the semiconductor substrate 21 is exposed. At the same time, the SiO$_2$ film 25 is also etched to decrease the thickness thereof. However, since the SiO$_2$ film 25 is relatively thick, it remains.

Figure 2E:
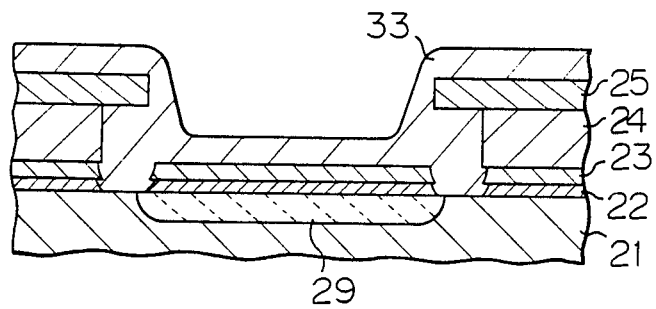

Referring to FIG. 2E, a second polycrystalline silicon film 33 having a thickness of, e.g., approximately 400 nm, is formed on the SiO$_2$ film 25 and the Si$_3$N$_4$ film 23 and within the opening 32 by a LPCVD method. The LPCVD features a good surface coverage whereby the cavity 30 and the opening 32 are filled with polycrystalline silicon.

Figure 2F:
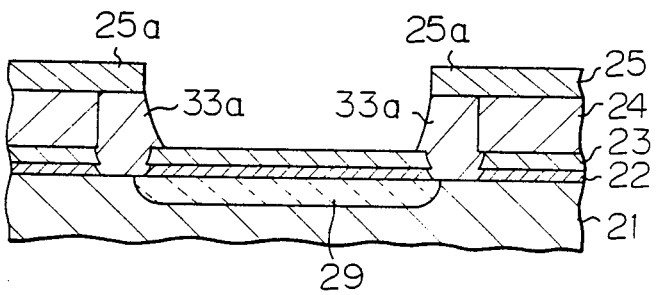

Referring to FIG. 2F, the second polycrystalline silicon film 33 is anisotropically etched to expose at least the Si$_3$N$_4$ film 23 by a reactive ion etching method using CCl$_4$ gas or CF$_4$/O$_2$ gas as an etchant. Therefore, a portion 33a of the second polycrystalline silicon film 33 remains under the protruding portion 25a.

Figure 2G:
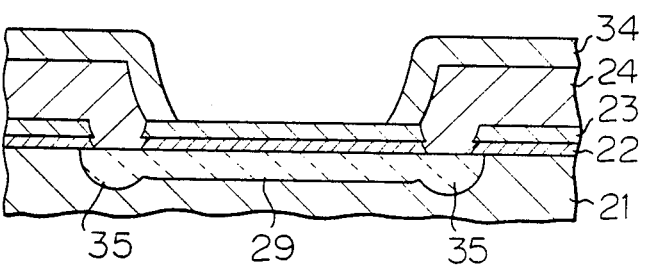

Referring to FIG. 2G, after the SiO$_2$ film 25 is removed by wet etching, the first polycrystalline silicon film 24 and the polycrystalline silicon portion 33a are thermally oxidized to form a SiO$_2$ film 34 having a thickness of, e.g., approximately 200 nm. At the same time, boron contained in the first polycrystalline silicon film 24 diffuses into the semiconductor substrate 21 through the polycrystalline silicon portion 33a to form a P$^+$-type region (a base contact region) 35.

Figure 2H:
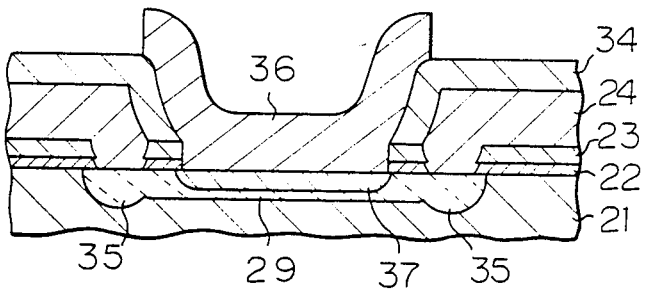

Referring to FIG. 2H, the exposed portion of the Si$_3$N$_4$ film 23 is etched and then the SiO$_2$ film 22 is etched to expose a surface of the semiconductor substrate 21 in the base region 29. At the same time, the SiO$_2$ film 34 is also etched to decrease the thickness thereof. However, since the SiO$_2$ film 34 is relatively thick, it remains. Next, a third polycrystalline silicon film doped with arsenic is formed on the SiO$_2$ film 34 and the base region 29 of the semiconductor substrate 21 by a LPCVD method and is patterned by a photolithographic method to form an emitter electrode 36. Heat-treatment is carried out so as to diffuse arsenic out of the emitter electrode 36 of the third polycrystalline silicon film into the semiconductor substrate 21 within the base region 29, so that an N$^+$-type region (an emitter region) 37 is formed. Thus, it is possible to produce a bipolar transistor similar to the first embodiment.

A process for producing a bipolar semiconductor device in accordance with a third embodiment of the present invention is illustrated in FIGS. 3A to 3H.

Figure 3A:
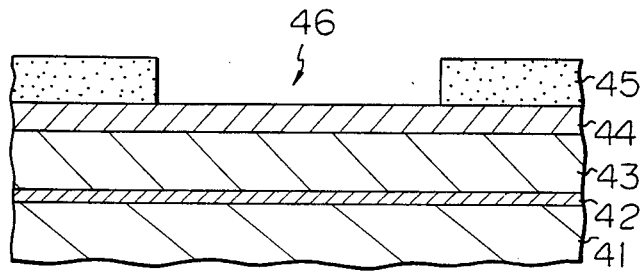
FIGS. 3A through 3H are partial sectional views of a bipolar semiconductor device in various stages of production in accordance with a third embodiment of the present invention.

Referring to FIG. 3A, a semiconductor substrate 41 in the (111) plane of silicon is thermally oxidized to form a SiO$_2$ film 42 having a thickness of, e.g., approximately 80 nm. The substrate 41 comprises an N-type silicon layer and a P-type single crystalline silicon substrate having a N$^+$-type buried layer, the N-type layer being epitaxially grown on the P-type substrate. A first polycrystalline silicon film 43 doped with boron and having a thickness of, e.g., approximately 300 nm, is formed on the SiO$_2$ film 42 by a LPCVD method. Successively, a SiO$_2$ film 44 having a thickness of approximately 400 nm is formed on the first polycrystalline silicon film 43 by a CVD method. A photoresist film 45 is spin coated on the SiO$_2$ film 44, exposed, and developed to form a window 46. The exposure is performed with patterned light through a photomask.

Figure 3B:
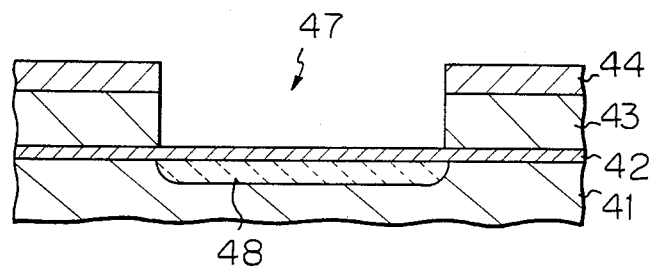

Referring to FIG. 3B, using the photoresist film 45 as a mask, the SiO$_2$ film 44 and the polycrystalline silicon film 43 are anisotropically etched by a reactive ion etching method to form an opening 47 having similar dimensions to the window 46. The photoresist film 45 is removed by means of a solvent. Using the SiO$_2$ film 44 and the polycrystalline silicon film 43 as a mask, boron ions are introduced into the semiconductor substrate 41 at a dose of approximately $8 \times 10^{12}$ ions/cm$^2$ by an ion-implantation method, so that a base (P-type) region 48 is formed.

Figure 3C:
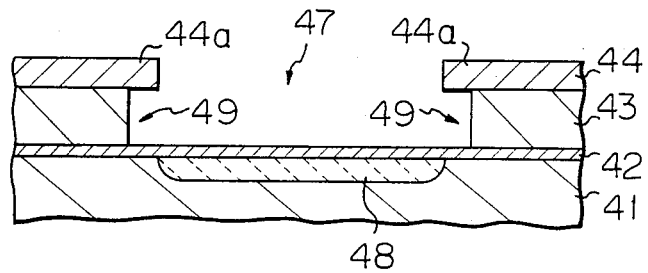

Referring to FIG. 3C, using the SiO$_2$ film 44 as a first masking film, the polycrystalline silicon film 43 is transversely etched by a plasma etching method using a CF$_4$/O$_2$ gas as an etchant. It is possible to utilize a wet etching method instead of the plasma etching method. Thus, a protruding portion 44a of the SiO$_2$ film 44 appears and a cavity 49 having a depth of, e.g., approximately 200 nm, is formed under the protruding portion 44a.

Figure 3D:
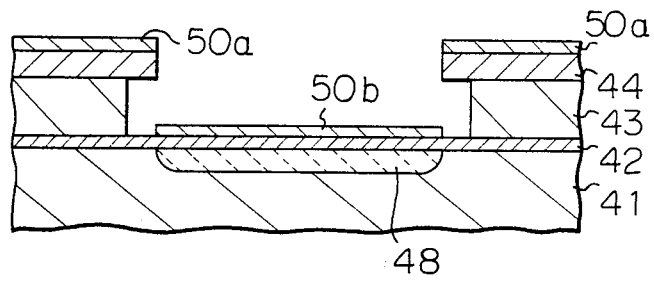

Referring to FIG. 3D, silicon nitride (Si$_3$N$_4$) is deposited on the SiO$_2$ film 44 and on a portion of the SiO$_2$ film 42 through the opening 47 by a sputtering method to form a first Si$_3$N$_4$ film 50a and a second Si$_3$N$_4$ film (a second masking film) 50b, the Si$_3$N$_4$ film having a thickness of, e.g., approximately 100 nm. The second Si$_3$N$_4$ film 50b does not cover the portion of the SiO$_2$ film 42 under the overhang portion 44a.

Figure 3E:
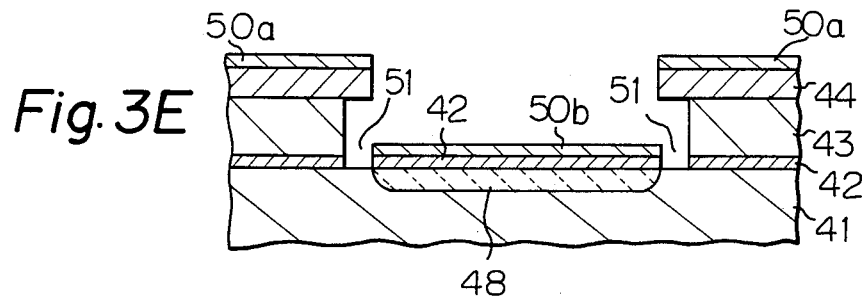

Referring to FIG. 3E, using the Si$_3$N$_4$ films 50a and 50b as a mask, the SiO$_2$ film 42 is selectively etched through the cavity 49 by a wet etching method using a solution of HF and NH$_4$F as an etchant, to form an opening 51. In the opening 51 a portion of the semiconductor substrate 41 is exposed.

Figure 3F:
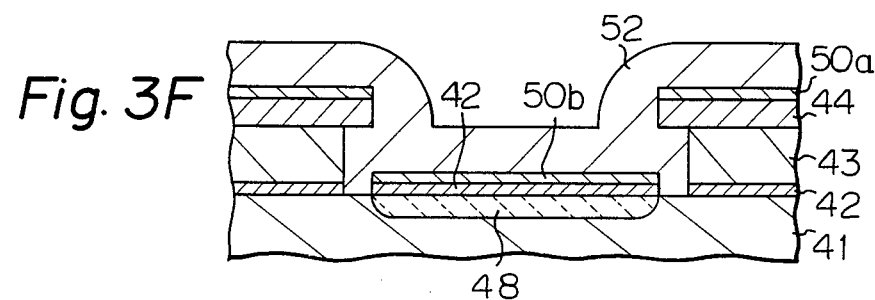

Referring to FIG. 3F, a second polycrystalline silicon film 52 having a thickness of, e.g., 400 nm, is formed on the Si$_3$N$_4$ films 50a and 50b and within the cavity 49 and the opening 51 by a LPCVD method.

Figure 3G:
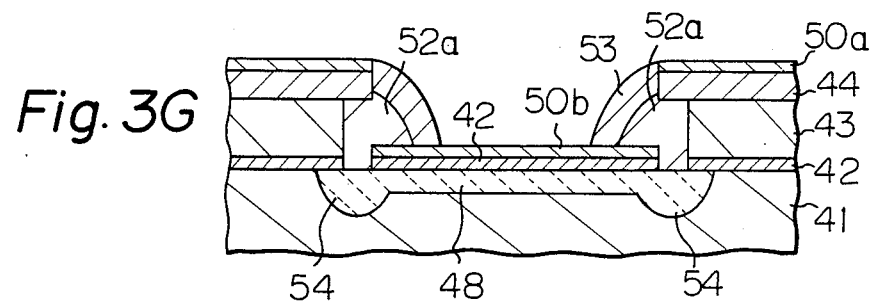

Referring to FIG. 3G, the second polycrystalline silicon film 52 is anisotropically etched to expose the second Si$_3$N$_4$ film 50b by a reactive ion etching method using CCl$_4$ gas or CF$_4$/O$_2$ gas as an etchant. As a result of the etching, a portion 52a of the second polycrystalline silicon film 52 remains so as to fill the cavity 49. The polycrystalline silicon portion 52a is thermally oxidized to form a SiO$_2$ film 53 having a thickness of, e.g., approximately 200 nm. At the same time, due to heating, boron contained in the first polycrystalline silicon 43 diffuses into the semiconductor substrate 41 through the polycrystalline silicon portion 52a to form a P+-type region (a base contact region) 54.

Figure 3H:
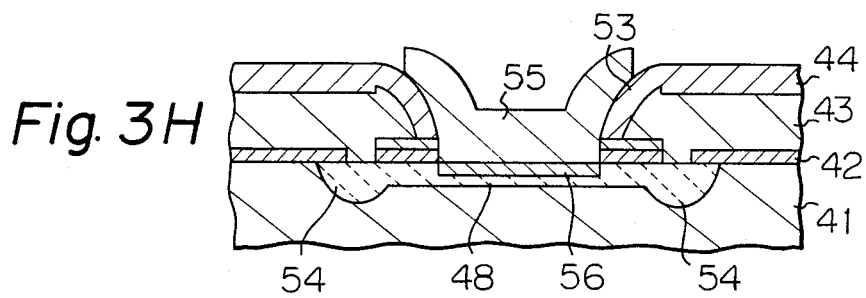

Referring to FIG. 3H, reactive ion etching is carried out so as to remove the exposed portion of the second $Si_3N_4$ film 50b and the portion of the $SiO_2$ film 42 to expose a surface of the semiconductor substrate 41. At the same time, the first $Si_3N_4$ film 50a is inevitably etched out and the $SiO_2$ films 44 and 53 are also etched to decrease the thickness thereof. In this case, since the $SiO_2$ films 44 and 53 are relatively thick, they remain. Then, a third polycrystalline silicon film doped with arsenic is formed on the remaining $SiO_2$ films 44 and 53 and the exposed surface of the semiconductor substrate 41 by a LPCVD method and is patterned (i.e., selectively etched) by a photo-lithographic method to form an emitter electrode 55. Heat-treatment is carried out so as to diffuse arsenic out of the emitter electrode 55 of the third polycrystalline silicon film into the semiconductor substrate 41 in the base region 48, so that an emitter region (an N+-type region) 56 is formed. Thus, it is possible to provide a bipolar transistor similar to the first embodiment.

A process for producing a bipolar semiconductor device in accordance with a fourth embodiment of the present invention is illustrated in FIGS. 4A to 4G.

Figure 4A:
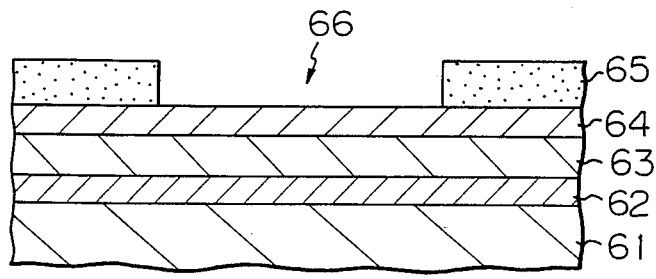
FIGS. 4A through 4G are partial sectional views of a bipolar semiconductor device in various stages of production in accordance with a fourth embodiment of the present invention.

Referring to FIG. 4A, a $SiO_2$ film 62 having a thickness of, e.g., 300 nm, is formed on a semiconductor substrate 61 of (111) plane silicon by a CVD method. The substrate 61 comprises an N-type silicon expitaxial layer and a P-type silicon single crystalline substrate with a N+-type buried layer. A first polycrystalline silicon film 63 doped with boron and having a thickness of, e.g., approximately 300 nm, is formed on the $SiO_2$ film 62 by a LPCVD method. Then, a $Si_3N_4$ insulating film 64 having a thickness of, e.g., approximately 300 nm, is formed on the polycrystalline silicon film 63 by a sputtering method. A photoresist film 65 is spin coated on the $Si_3N_4$ insulating film 64, exposed, and developed to form a window 66. The exposure is performed with patterned light through a photomask.

Figure 4B:
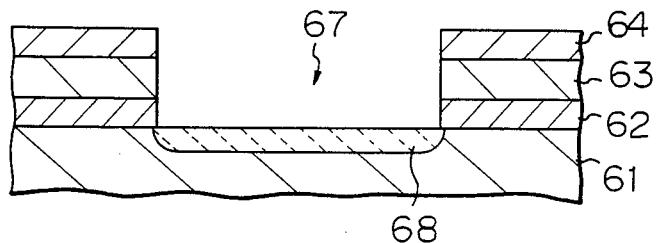

Referring to FIG. 4B, using the photoresist film 65 as a mask, the SiO insulating film 64 and the polycrystalline silicon film 63 are successively anisotropically etched by a reactive ion etching method to form an opening 67. The dimensions of the opening 67 are similar to those of the window 66. After the photoresist film 65 is removed, boron ions are directly introduced into the semiconductor substrate 61 at a dose of approximately $8 \times 10^{12}$ ions/cm$^2$ by an ion-implantation method, to form a base (P-type) region 68.

Figure 4C:
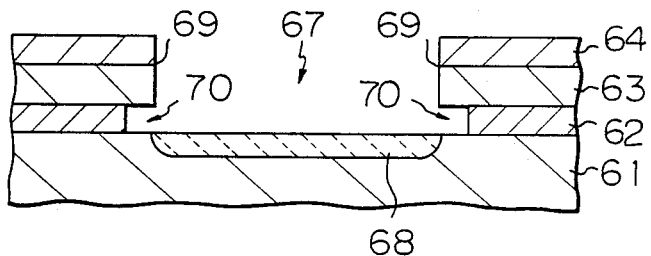

Referring to FIG. 4C, using the $Si_3N_4$ insulating film 64 and the polycrystalline silicon film 63 as a first masking film, the $SiO_2$ film 62 is transversely etched by a wet etching method using a mixture solution of HF and $NH_4F$ as an etchant. Therefore, a protruding portion 69 including portions of the $Si_3N_4$ insulating film 64 and the polycrystalline silicon film 63 is formed, and a cavity 70 having a depth of, e.g., 200 nm, is formed under the protruding portion 69.

Figure 4D:
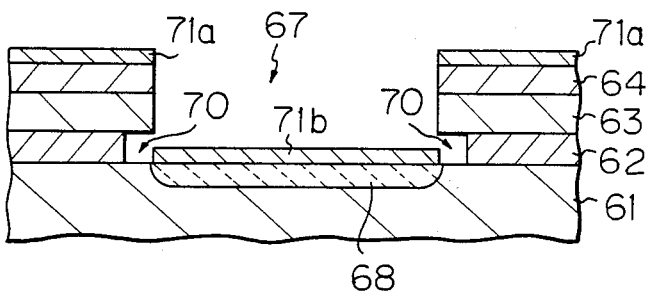

Referring to FIG. 4D, $Si_3N_4$ is deposited on the $Si_3N_4$ insulating film 64 and on a portion of the semiconductor substrate 61 through the opening 67 by a sputtering method, so that a first $Si_3N_4$ film 71a and a second $Si_3N_4$ film 71b having a thickness of, e.g., approximately 100 nm are formed. The second $Si_3N_4$ film 71b does not cover the portion of the semiconductor substrate 61 under the protruding portion 69.

Figure 4E:
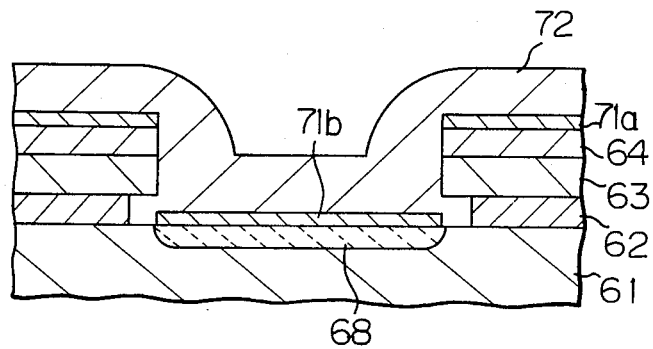

Referring to FIG. 4E, a second polycrystalline silicon film 72 having a thickness of, e.g., 400 nm is formed on the $Si_3N_4$ films 71a and 71b and within the 70 by a LPCVD method.

Figure 4F:
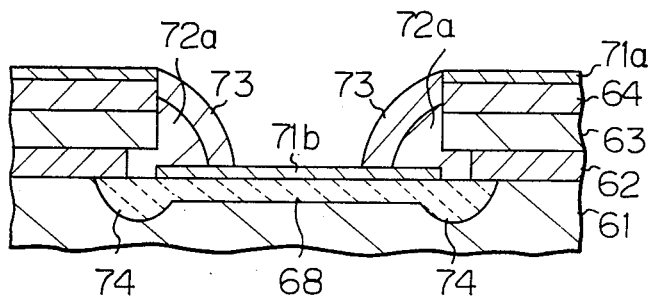

Referring to FIG. 4F, the second polycrystalline silicon film 72 is anisotropically etched to expose the second $Si_3N_4$ film 71b by a reactive ion etching. As a result of the etching, a portion 72a of the second polycrystalline silicon film 72 remains so as to fill the cavity 70. The polycrystalline silicon portion 72a is thermally oxidized to form a $SiO_2$ film 73 having a thickness of, e.g., approximately 200 nm. At the same time, due to heating, boron contained in the first polycrystalline silicon 63 diffuses into the semiconductor substrate 61 through the polycrystalline silicon portion 72a to form a P+-type region (a base contact region) 74.

Figure 4G:
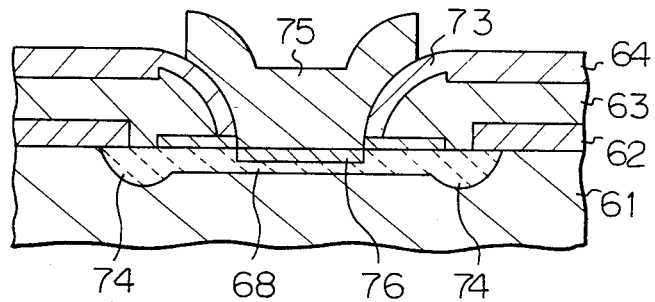

Referring to FIG. 4G, the exposed portion of the $Si_3N_4$ film 71b is etched by a reactive ion etching method or a wet etching method using a solution of hot phosphoric acid to expose a surface of the semiconductor substrate 61. During the etching, the first $Si_3N_4$ film 71a is also etched out. Then, a third polycrystalline silicon film doped with arsenic is formed by a LPCVD method and is patterned by a photo-lithographic method to form an emitter electrode 75. Heat-treatment is carried out so as to diffuse arsenic out of the emitter electrode 75 into the semiconductor substrate 61, so that an emitter (N+-type) region 76 is formed in the base region 68. Thus, it is possible to produce a bipolar transistor similar to that of the first embodiment. In this embodiment, there is no step for forming an opening within a cavity in which the semiconductor substrate appears, as in the first through third embodiments.

A process for producing an MOS semiconductor device in accordance with a fifth embodiment of the present invention is illustrated in FIGS. 5A to 5H.

Figure 5A:
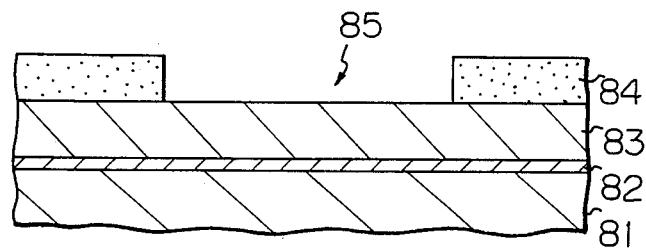
FIGS. 5A through 5H are partial sectional views of an MOS semiconductor device in various stages of production in accordance with a fifth embodiment of the present invention.

Referring to FIG. 5A, a $Si_3N_4$ film 82 having a thickness of, e.g., approximately 100 nm, is formed on a P-type silicon semiconductor substrate 81 having a thick field oxide film (not shown) by a CVD method. It is possible to form a double layer film composed of a $SiO_2$ film and a $Si_3N_4$ film instead of the $Si_3N_4$ film 82. For example, the double layer may consist of a $SiO_2$ film which is formed by a thermal oxidation method and has a thickness of, e.g., 50 nm and a $Si_3N_4$ film which is formed on the $SiO_2$ film by a CVD method and has a thickness of, e.g., 100 nm. Next, a first polycrystalline silicon film 83 doped with arsenic and having a thickness of, e.g., 400 nm is formed on the $Si_3N_4$ film 82 by a LPCVD method. A photoresist film 84 is spin coated on the polycrystalline silicon film 83, exposed, and developed to form a window 85 and to expose the surface of the polycrystalline silicon film over unactive area of the element and over the field oxide layer. The exposure is performed with light through a photomask having a predetermined pattern.

Figure 5B:
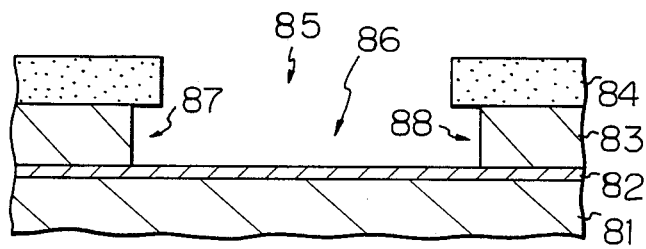

Referring to FIG. 5B, using the photoresist film 84 as a first masking film, the first polycrystalline silicon film 83 is anisotropically etched by a reactive ion etching method to form an opening 86, the dimensions of which are similar to the window 85. Subsequently, the polycrystalline silicon film 83 is transversely etched so as to enlarge the opening 86 by a wet etching method or a plasma etching method using a mixture gas of $CF_4$ gas and $O_2$ gas as an etchant. As a result of these etching treatments, protruding portions of the photoresist film 84 appear and the cavities 87 and 88 having a depth of, e.g., 200 nm, are formed under the protruding portions.

Figure 5C:
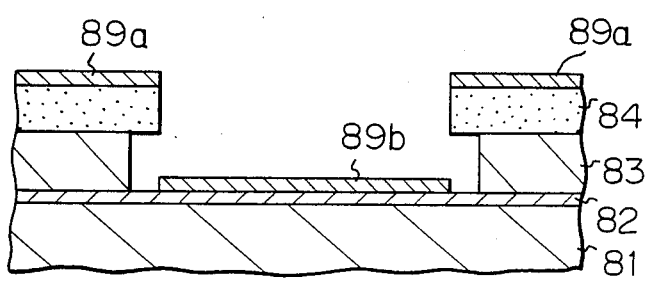

Referring to FIG. 5C, Al is deposited by a vacuum deposition method or a sputtering method to form a first Al film 89a on the photoresist film 84 and a second Al film (a second masking film) 89b on the $Si_3N_4$ film 82, the thickness of the Al films being, e.g., 100 nm. The second Al film 89b does not cover the portion of the $Si_3N_4$ film 82 under the protruding portions.

Figure 5D:
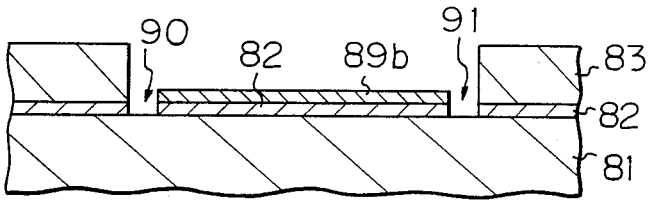

Referring to FIG. 5D, the photoresist film 84 is removed by means of a solvent, whereupon the first Al film 89a on the photoresist film 84 is removed. Using the second Al film 89b as a mask, the $Si_3N_4$ film 82 is selectively etched to form narrow stripe openings 90 and 91 by a reactive ion etching method using a $CF_4/O_2$ gas as an etchant. In the openings 90 and 91 portions of the semiconductor substrate 81 appear. At the same time, the polycrystalline silicon film 83 is etched to decrease the thickness thereof, but still remains.

Figure 5E:
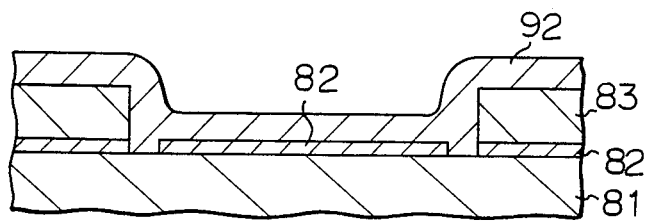

Referring to FIG. 5E, after the second Al film 89b is removed, a second polycrystalline silicon film 92 having a thickness of, e.g., 300 nm, is formed on the first polycrystalline silicon film 83 and the $Si_3N_4$ film 82 and within the openings 90 and 91 by a LPCVD method.

Figure 5F:
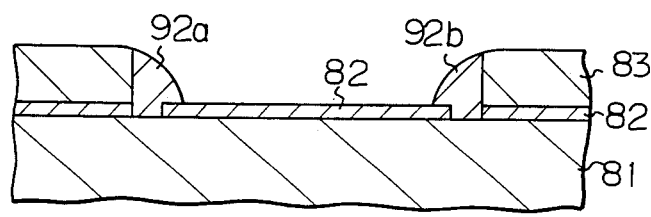

Referring to FIG. 5F, the second polycrystalline silicon film 92 is anisotropically etched so as to expose the $Si_3N_4$ film 82 by a reactive ion etching method using $CCl_4$ gas or $CF_4/O_2$ gas as an etchant. As a result of the etching, portions 92a and 92b adjoining the walls of the cavities 87 and 88 can remain.

Figure 5G:
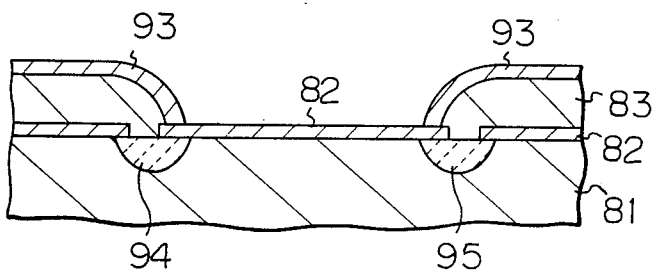

Referring to FIG. 5G, the first polycrystalline silicon film 83 and the polycrystalline silicon portions 92a and 92b are thermally oxidized to form a $SiO_2$ film 93 having thickness of, e.g., 200 nm. During the heating, arsenic contained in the first polycrystalline silicon film 83 diffuses into the semiconductor substrate 81 through the polycrystalline silicon portions 92a and 92b to form $N^+$-type regions, i.e., a source region 94 and a drain region 95, respectively.

Figure 5H:
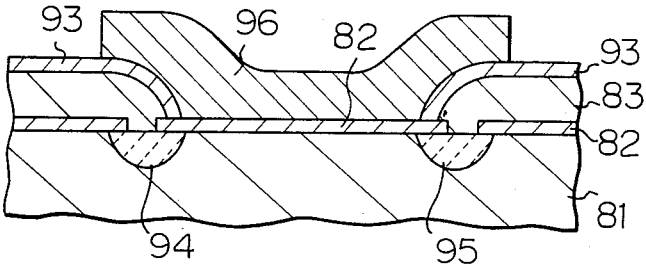

Referring to FIG. 5H, an Al film is formed on the $SiO_2$ film 93 and the $Si_3N_4$ film 82 by a sputtering method or a vacuum deposition method and is patterned (i.e., selectively etched) by a photo-lithographic method to form a gate electrode 96. In this case, the $Si_3N_4$ film 82 under the gate electrode 96 serves as a gate insulating film. Thus, it is possible to produce by self-alignment an MOS transistor having a source region, channel region, and drain region of a total length of not more than 1 μm.

A process for producing a bipolar semiconductor device provided with a metal silicide film as a second conductive film in accordance with a sixth embodiment of the present invention is illustrated in FIGS. 6A to 6H.

Figure 6A:
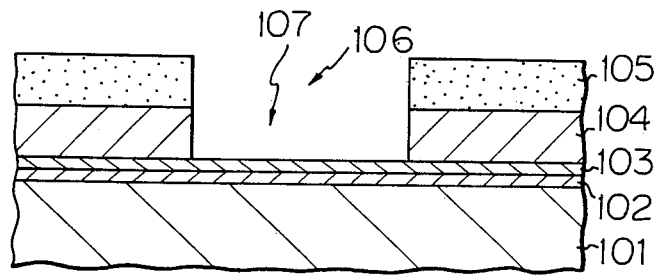
FIGS. 6A through 6H are partial sectional views of a bipolar semiconductor device in various stages of production in accordance with a sixth embodiment of the present invention.

Referring to FIG. 6A, a silicon semiconductor substrate 101 is thermally oxidized to form a $SiO_2$ film 102 having a thickness of, e.g., 50 nm. The substrate 101 comprises an N-type silicon layer and a P-type single crystalline silicon substrate having an $N^+$-type buried layer, the N-type layer being epitaxially grown on the P-type substrate. A $Si_3N_4$ film 103 having a thickness of, e.g., 100 nm is formed on the $SiO_2$ film 102 by a CVD method. A polycrystalline silicon film 104 which is doped with boron of, e.g., $1+10^{20}/cm^3$ and has a thickness of, e.g., 300 nm, is formed on the $Si_3N_4$ film 103 by a LPCVD method. A photoresist film 105 is spin coated on the polycrystalline silicon film 104, exposed, and developed to form a window 106. When the exposure is carried out, a photomask with a predetermined pattern is used. Then, the polycrystalline silicon film 104 is anisotropically etched through the window 106 by a reactive ion etching method to form an opening 107 having similar dimensions to those of the window 106.

Figure 6B:
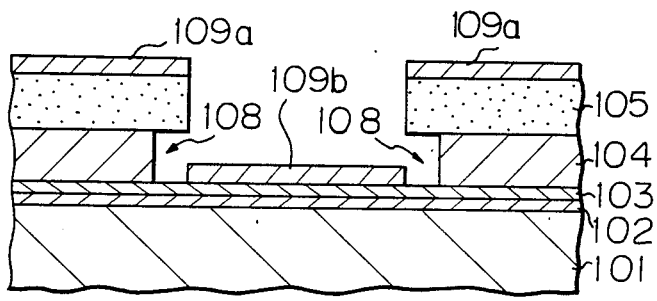

Referring to FIG. 6B, the polycrystalline silicon film 104 is further transversely etched so as to enlarge the opening 107 by a plasma etching method or a wet etching method. Accordingly, a protruding portion of the resist film 105 is formed around the window 106, and a cavity 108 is formed under the protruding portion. Next, Al is deposited by a vacuum deposition method or a sputtering method to form a first Al film 109a on the photoresist film 104 and a second Al film 109b on the $Si_3N_4$ film 103, respectively. The second Al film 109b does not cover the portion of the $Si_3N_4$ film 103 under the protruding portion.

Figure 6C:
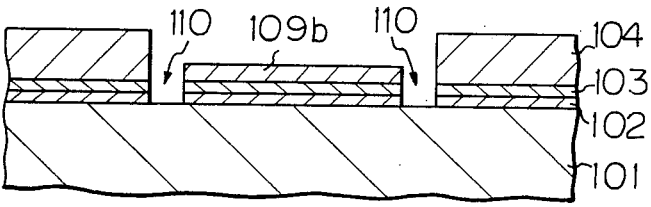

Referring to FIG. 6C, the photoresist film 105 is removed, whereupon the first Al film 109a is also removed. Using the second Al film 109b as a mask, the $Si_3N_4$ film 103 and the $SiO_2$ film 102 are successively selectively etched by utilizing a suitable etching method to form an opening 110 in which a portion of the semiconductor substrate 101 is exposed.

Figure 6D:
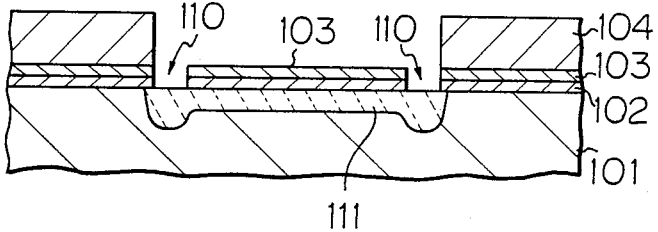

Referring to FIG. 6D, the second Al film 109b is removed by a wet etching method. Then, boron ions are introduced into the semiconductor substrate 101 by an ion-implantation method to form a base (P-type) region 111.

Figure 6E:
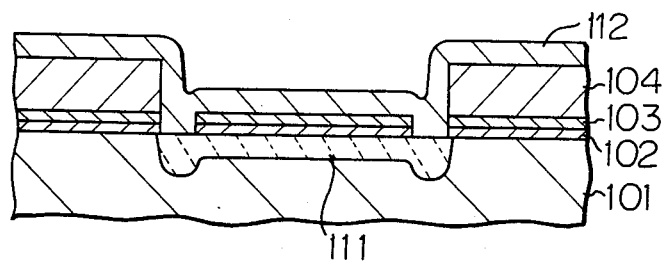

Referring to FIG. 6E, a metal film 112 having a thickness of, e.g., 150 nm is formed on the polycrystalline silicon film 104 and the $Si_3N_4$ film 103 and within the opening 110 by a sputtering method or a vacuum deposition method. The metal of film 112 should react with the silicon to form metal silicide. For example, the metal may be molybdenum, tungsten, titanium, tantalum, platinum, zirconium or hafnium, and the metal silicide may be molybdenum silicide ($MoSi_2$), tungsten silicide ($WSi_2$), titanium silicide ($TiSi_2$), tantalum silicide ($TaSi_2$), platinum silicide ($PtSi_2$), zirconium silicide ($ZrSi_2$), or hafnium silicide ($HfSi_2$). In this case, a Mo film 112 is formed.

Figure 6F:
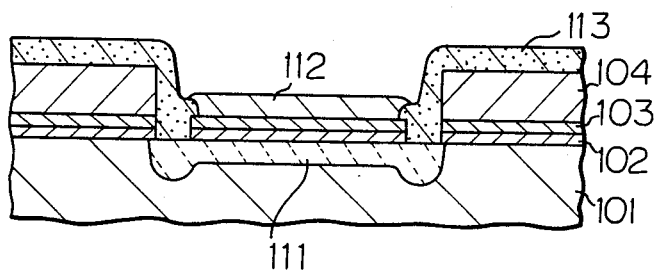

Referring to FIG. 6F, heat treatment (e.g., at 600° C. for 30 minutes under a nitrogen atmosphere) is performed so as to convert a portion of the Mo film 112 coming into contact with the polycrystalline silicon film 104 and the silicon semiconductor substrate 101 into a $MoSi_2$ film 113. The portion of the Mo film 112 on the $Si_3N_4$ film 103 remains.

Figure 6G:
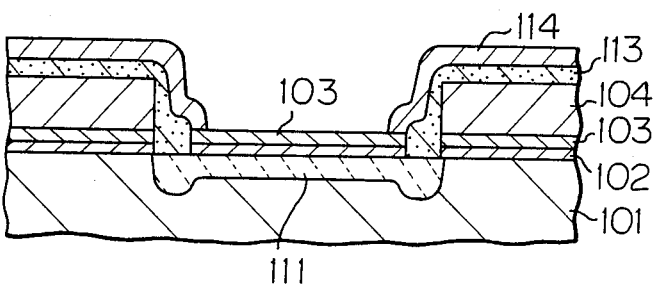

Referring to FIG. 6G, the remaining Mo film 112 is removed by a wet etching method using an etching solution of, e.g., $HNO_3:H_2O:CH_3COOH:H_3PO_4=1:2:5:25$. Then, the $MoSi_2$ film 113 is thermally oxidized to form a $SiO_2$ film 114. Instead of such oxidization, an insulating film of $SiO_2$, $Si_3N_4$ or phosphosilicate glass may be selectively formed on the $MoSi_2$ film 113 by a CVD method.

Figure 6H:
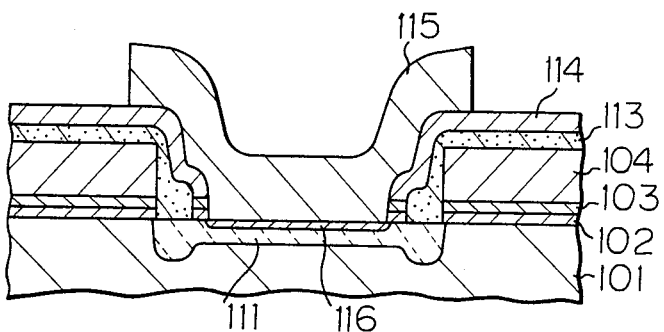

Referring to FIG. 6H, the exposed portion of the $Si_3N_4$ film 103 and the $SiO_2$ film 102 under it are etched by using a suitable etchant to expose a portion of the semiconductor substrate 101 in the base region 111. Next, another polycrystalline silicon film doped with arsenic is formed on the exposed semiconductor substrate 101 and the insulating film 114 by a LPCVD method and is patterned by a photo-lithographic method to form an emitter electrode 115. Heat treatment is carried out so as to diffuse arsenic out of the emitter electrode 115 into the semiconductor substrate 101, so that an N+-type region (an emitter region) 116 is formed within the base region 111. Thus, it is possible to produce, by self-alignment a bipolar transistor. In this embodiment, since the metal silicide film having a lower electric resistance than that of doped polycrystalline silicon is used as a part of the base electrode, an external base resistance can be reduced as compared with a base electrode comprised of doped polycrystalline silicon. Accordingly, it is possible to increase the operating speed and to decrease dissipation power of a bipolar transistor.

It will be obvious that the present invention is not restricted to the above-mentioned embodiments and that many variations are possible for persons skilled in the art without departing from the scope of the invention. For example, after the formation of the opening 107 in FIG. 6A, a base region can be formed by an ion-implantation method. Another photoresist film (not shown) is selectively formed in the opening 107 on a portion of the $Si_3N_4$ film 103 corresponding to an emitter electrode contact window, so as to expose another portion of the $Si_3N_4$ film 103 corresponding to a base electrode contact window. The exposed portion of the $Si_3N_4$ film 103 and the portion of the $SiO_2$ film 102 being under it are selectively etched by utilizing a suitable etching method to form the opening 110, as illustrated in FIG. 6C. As a result, a device similar to that illustrated in FIG. 6D is obtained. Thereafter, a base electrode and an emitter electrode can be formed in a similar manner to that described in the fixth embodiment, referring to FIGS. 6E through 6H.

We claim:

1. A method of producing a semiconductor device having a substrate, comprising the steps of:
   (a) forming an insulating film on the semiconductor substrate;
   (b) forming a first conductive film on the first insulating film;
   (c) forming a first masking film having a window on the first conductive film;
   (d) selectively etching the first conductive film to form an opening having similar dimensions to those of the window;
   (e) transversely etching the first conductive film to enlarge the opening and to form a protruding portion of the first masking film;
   (f) forming, through the window, a second masking film on the insulating film;
   (g) selectively etching an uncovered portion of the insulating film under the protruding portion to expose a surface portion of the semiconductor substrate; and
   (h) forming a second conductive film connecting a side of the first conductive film and the exposed surface portion of the semiconductor substrate.

2. A method according to claim 1, wherein said step (a) comprises selecting the insulating film from the group consisting of silicon dioxide and silicon nitride.

3. A method according to claim 1, wherein said step (a) comprises forming the insulating film from a double-layer film including a silicon dioxide film and a silicon nitride film formed thereon.

4. A method according to claim 1, wherein said step (b) comprises forming the first conductive film from doped polycrystalline silicon.

5. A method according to claim 1, wherein said step (c) comprises selecting the first masking film from the group consisting of resist, silicon dioxide and silicon nitride.

6. A method according to claim 1, wherein said step (f) comprises selecting the second masking film from the group consisting of aluminum and silicon nitiride.

7. A method according to claim 1, wherein said step (h) comprises forming the second conductive film from an oxidizable electrically conductive material.

8. A method according to claim 7, wherein said step (h) comprises selecting the second conductive film from the group consisting of doped polycrystalline silicon and metal silicide.

9. A method according to claim 8, further comprising selecting the metal silicide from the group consisting of molybedenum silicide, tungsten silicide, titanium silicide, tantalum silicide, platinum silicide, zirconium silicide and hafniuim silicide.

10. A method according to claim 1, further comprising, after said etching step (g) the step of removing the second maskIng film.

11. A method according to claim 10, wherein said forming step (h) comprises the substeps of:
   (i) forming the second conductive film of doped polycrystalline silicon on the entire exposed surface of the semiconductor device; and
   (ii) anisotropically etching the second conductive film, until the insulating film is exposed, leaving a portion of the second conductive film adjoining the side of the first conductive film.

12. A method according to claim 11, wherein after said forming step (h), said method further comprises the steps of:
   (i) introducing impurities into the semiconductor substrate by an ion-implantation process to form a base region;
   (j) carrying out a heat treatment under an oxidizing atmosphere, whereby the second conductive film is oxidized to form an oxide film and, simultaneously, impurities doped in the first conductive film and the second conductive film diffuse into the semiconductor substrate to form a base contact region;
   (k) removing the exposed portion of the insulating film;
   (l) forming an emitter electrode of doped polycrystalline silicon or doped silicide; and
   (m) carrying out a heat treatment to diffuse impurities, doped in the emitter electrode, into the semiconductor substrate to form an emitter region.

13. A method according to claim 11, wherein after said forming step (h), said method further comprises the steps of:
   (i) carrying out a heat treatment under an oxidizing atmosphere whereby the second conductive film is oxidized to form an oxide film and, simultaneously, impurities doped in the first and second conductive films diffuse into the semiconductor substrate to form a source region and a drain region; and
   (j) forming a gate electrode on the insulating film.

14. A method according to claim 10, wherein, after said removing step, said method further comprises the step of introducing impurities into the semiconductor substrate by an ion-implantation process to form a base region ; and
   wherein said forming step (h) comprises the substeps of:
   (i) forming a metal film on the insulating film, the first conductive film of doped polycrystalline silicon, and the exposed area of the semiconductor substrate;
(ii) converting portions of the metal film, in contact with the first conductive film and the semiconductor substrate, into a metal silicide film by a heat treatment;
(iii) removing a portion of the metal film lying on the insulating film; and
(iv) thermally oxidizing the metal silicide film to form an oxide film.

15. A method according to claim 14, wherein after said thermally oxidizing substep (iv), said method further comprises the substeps of:
(v) removing the exposed portion of the insulating film;
(vi) forming an emitter electrode of doped polycrystalline silicon; and
(vii) carrying out a heat treatment to diffuse impurities, doped in the emitter electrode, into the semiconductor substrate to form an emitter region.

16. A method according to claim 1, wherein ssid forming step (h) comprises the substeps of:
(i) forming the second conductive film of doped polycrystalline silicon on the second masking film and the exposed surface portion of the semiconductor substrate; and
(ii) anisotropically etching the second conductive film until the insulating film is exposed, leaving a portion of the second conductive film adjoining the side of the first conductive film.

17. A method according to claim 16, wherein after said forming step (h), said method further comprises the steps of:
(i) introducing impurities into the semiconductor substrate by an ion-implantation process to form a base region;
(j) carrying out a heat treatment under an oxidizing atmosphere, whereby the second conductive film is oxidized to form an oxide film and, simultaneously, impurities doped in the first conductive film and the second conductive film diffuse into the semiconductor substrate to form a base contact region;
(k) removing the exposed portion of the insulating film;
(l) forming an emitter electrode of doped polycrystalline silicon; and
(m) carrying out a heat treatment to diffuse impurities, doped in the emitter electrode, into the semoconductor substrate to form an emitter region.

18. A method according to claim 16, wherein after said forming step (h), said method further comprises the steps of:
(i) carrying out a heat treatment under an oxidizing atmosphere whereby the second conductive film is oxidized to form an oxide film and, simultaneously, impurities doped in the first and second conductive films diffuse into the semiconductor substrate to form a source region and a drain region; and
(j) forming a gate electrode on the insulating film.

* * * * *

UNITED STATES PATENT AND TRADEMARK OFFICE
CERTIFICATE OF CORRECTION

PATENT NO. : 4,545,114
DATED : OCTOBER 8, 1985
INVENTOR(S) : TAKASHI ITO ET AL.

It is certified that error appears in the above-identified patent and that said Letters Patent is hereby corrected as shown below:

ABSTRACT [57] line 9, "forming a second masking film" should be --formed--.

Col. 1, line 55, delete "to".

Col. 4, line 42, delete "the" (first occurrence).

Col. 8, line 5, after "the" (second occurrence) insert --cavity--.

Col. 9, line 36, "semicondutor" should be --semiconductor--.

Col. 11, line 3, "alignment" should be --alignment,--;
line 31, "fixth" should be --sixth--.

Col. 13, line 21, "ssid" should be --said--.

Col. 14, line 18, "semo-" should be --semi --.

Signed and Sealed this

Twenty-eighth Day of January 1986

[SEAL]

Attest:

DONALD J. QUIGG

Attesting Officer

Commissioner of Patents and Trademarks